US005194853A

United States Patent [19]

Asada

[11] Patent Number: 5,194,853

[45] Date of Patent: Mar. 16, 1993

[54] SCANNING CIRCUIT

[75] Inventor: Hideki Asada, Tokyo, Japan

[73] Assignee: GTC Corporation, Tokyo, Japan

[21] Appl. No.: 810,484

[22] Filed: Dec. 19, 1991

[30] Foreign Application Priority Data

Mar. 22, 1991 [JP] Japan .................................. 3-83499

[51] Int. Cl.[5] ...................... G09G 3/18; H03K 19/096

[52] U.S. Cl. .................................. 340/784; 340/719; 340/789; 307/481

[58] Field of Search ........................ 307/475, 480–481, 307/441, 442, 448, 445; 340/784, 789, 718, 719; 358/241; 359/85

[56] References Cited

U.S. PATENT DOCUMENTS 4,710,648 12/1987 Hanamura et al. ................ 307/443
4,789,899 12/1988 Takahashi et al. ................ 358/241
5,021,774 6/1991 Ohwada et al. .................... 340/754
5,063,378 11/1991 Roach ................................ 340/784

*Primary Examiner*—Edward P. Westin
*Assistant Examiner*—Andrew Sanders
*Attorney, Agent, or Firm*—Iandiorio & Dingman

[57] ABSTRACT

A scanning circuit for successively scanning a plural number of capacitive loads comprising: a delay circuit 101 for delaying a supplied pulse signal from a previous stage in accordance with a first clock signal; a switching transistor 102 which is controlled by the first clock signal; an EXNOR circuit 103 which judges whether or not the signal generated by the delay circuit 101 is correct; a non-inverting buffer circuit 104 for reserve of the delay circuit 101; switching transistors 105 and 106 which are controlled in accordance with the signal generated by the EXNOR circuit 103; and an output buffer circuit 107 which is controlled in accordance with the first clock signal or a second clock signal. Accordingly, the scanning circuit can operate correctly even if one of the delay circuit 101 or the non-inverting buffer circuit 104 fails.

10 Claims, 7 Drawing Sheets

SCANNING CIRCUIT

BACKGROUND OF THE INVENTION

1. Field of the Invention

The preset invention relates to a scanning circuit which is suitable for scanning large-scale liquid crystal displays.

2. Background Art

Conventionally, there is known a technology in which a liquid crystal display is integrated together with its driving circuit on a glass substrate. Accordingly to this technology, electrodes for the pixels of the displays and the driving circuits are mounted on the same substrate. Because of this, the number of terminals and the number of required external ICs are sharply reduced. Furthermore, lowered reliability, which is caused by efficiency limits of bonding processes for large surface areas of the circuits and the high-densities of the circuits, can be resolved.

In the driving circuit, a scanning circuit consisting of shift-registers and buffers is provided. For example, in an active-matrix type liquid crystal display, the scanning circuit is used as one of the important constituents such as a vertical driving circuit or a block pulse scanning circuit.

In FIG. 6, a (2N−1)th bit part and a 2Nth bit part of a conventional scanning circuit is shown (where N equals a natural number).

Each shift-register 601 delays an input signal thereto for a prespecified clock cycle which is defined by clock signals $\phi 1$ and $\phi 1$, and then generates the delayed signal to a shift register in the next stage. Signals respectively generated by the registers 601 are generated as a scanning pulse signal via corresponding output buffers 107. FIG. 7 is a timing chart showing an operation of the conventional scanning circuit shown in FIG. 6. As shown in FIG. 7, the scanning pulse signals generated from the (2N−1)th bit part and the 2Nth bit part are respectively synchronizing with corresponding output signals A and B.

Recently, the surface areas of liquid crystal displays have been enlarged; so that it have been difficult to manufacture the associated circuits of the displays without any defects. In particular, if only one defective register appears in a scanning circuit which contains serially connected shift registers as shown in FIG. 6, the scanning circuit will not transmit the scanning signal.

Accordingly, the percentage of defective scanning circuits and therefore percentage of defects of entire liquid crystal displays have been increased.

SUMMARY OF THE INVENTION

It is accordingly an object of the present invention is to provide a scanning circuit which is fully functional even if a few defects exists, thereby minimizing the percentage of defects of the entire liquid crystal displays.

In a first aspect of the present invention, there is provided a scanning circuit for successively scanning a plural number of capacitive loads comprising:

a delay circuit for delaying a supplied pulse signal from a previous stage in accordance with a first clock signal;

a first switching transistor which receives the pulse signal and is controlled by the first clock signal;

an exclusive OR circuit which receives a signal generated by the delay circuit and a signal generated by the first switching transistor;

a first non-inverting buffer circuit which receives the signal generated by the first switching transistor;

a second switching transistor which receives the signal generated by the delay circuit and is controlled in accordance with an inverted signal of the signal generated by the exclusive OR circuit;

a third switching transistor which receives a signal generated by the first non-inverting buffer circuit and is controlled in accordance with the signal generated by the exclusive OR circuit; and an output buffer circuit which receives signals respectively generated by the second switching transistor and the third switching transistor and is controlled in accordance with the first clock signal or a second clock signal.

According to the above-described circuit, when a defect appears in the delay circuit so that the output signal thereof is incorrect, the exclusive OR circuit generates a "0" level signal. Then, in response to the signal, the second switching transistor is turned off, and the third switching transistor is turned on. Hence, the signal generated by the first non-inverting buffer circuit will be supplied to the output buffer circuit and to a next stage as an input signal thereto.

The signal generated by the first non-inverting buffer circuit is the same as the signal generated by the delay circuit when it operates correctly, so that the whole device of the scanning circuit operates correctly.

Furthermore, in the case where the delay circuit fails and at the same time the exclusive OR circuit fails such that output signal thereof is fixed to the "0" level, the output signal of the first non-inverting buffer circuit will be selected, so that the whole device of the scanning circuit also operates correctly.

Furthermore, in the case where the first non-inverting buffer circuit has a defect and the delay circuit has no defect, the output signal of the exclusive OR circuit will be set to the "1" level, so that the second switching transistor will be turned on, and the third switching transistor will be turned off. Hence, the signal generated by the delay circuit will be supplied to the output buffer circuit and to a next stage as an input signal thereto, so that the whole device of the scanning circuit also operates correctly.

Furthermore, in the case where the first non-inverting buffer circuit fails and at the same time the exclusive OR circuit fails such that output signal thereof is fixed to the "1" level, the output signal of the delay circuit will be selected, so that the whole device of the scanning circuit also operates correctly.

As described above, the scanning circuit according to the present invention operates correctly even if a variety of defects exist in the circuits therein, thereby minimizing the percentage of defective scanning circuits.

DESCRIPTION OF THE PREFERRED EMBODIMENT

Further objects and advantages of the present invention will be apparent from the following description, reference being made to the accompanying drawings wherein preferred embodiments of the present invention are clearly shown.

FIRST EMBODIMENT

Figure 1:
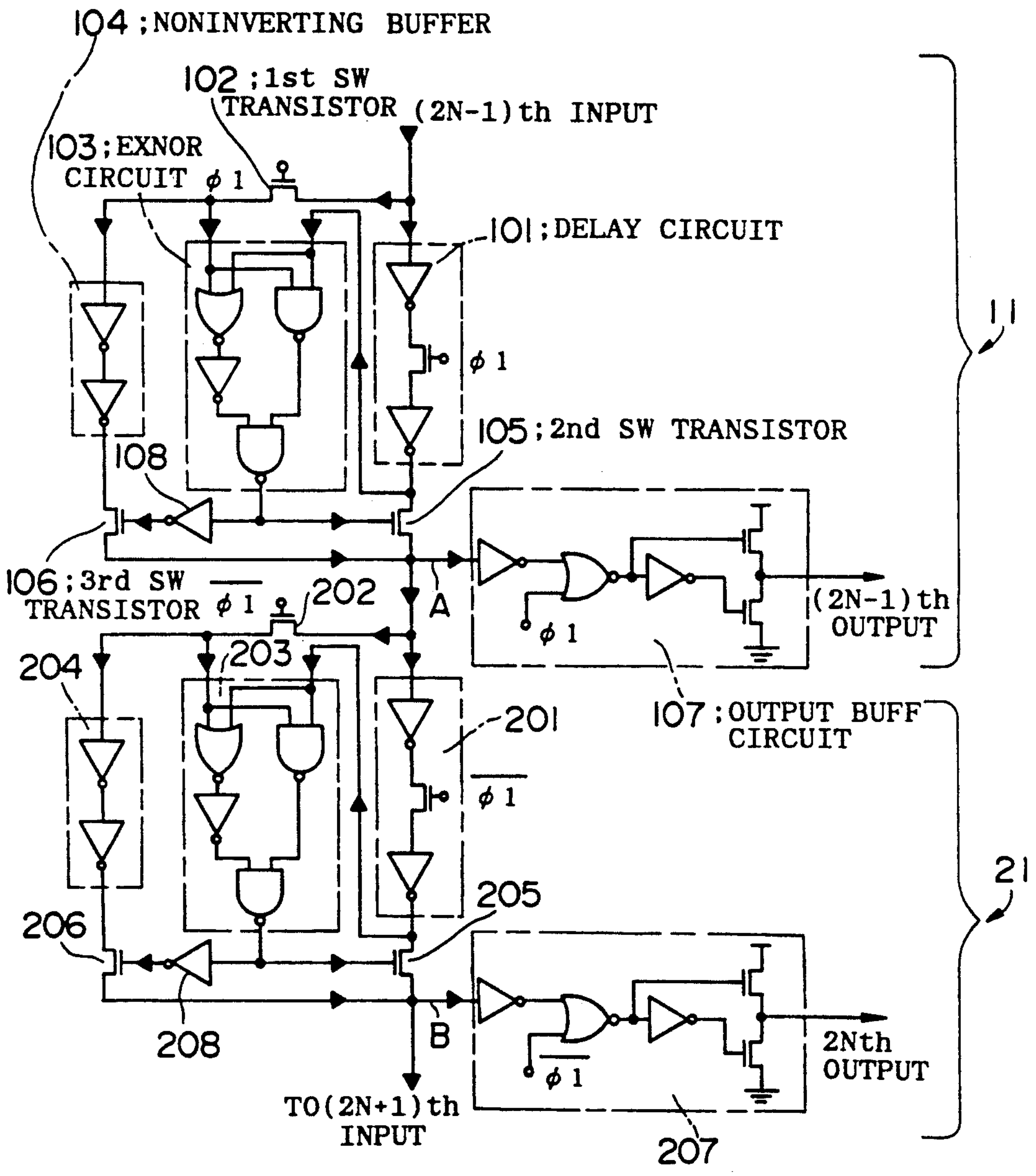
FIG. 1 is a block diagram showing an electronic configuration of a scanning circuit according to a first embodiment of the present invention.

FIG. 1 is a block diagram showing an electronic configuration of a scanning circuit composed of NMOS type transistors for driving a liquid crystal display according to a first embodiment of the present invention. FIG. 1 shows a (2N−1)th bit part (i.e. odd number part) 11 and a 2Nth bit part (i.e., even number part) 21. The (2N−1)th bit part 11 is provided with a delay circuit 101, and the delay time thereof depends on clock signal $\phi$1. Similarly, the 2Nth bit part 21 is provided with a delay circuit 201, and the delay time thereof depends on clock signal $\phi$1.

Furthermore, 102 and 202 designate first switching transistors which are respectively turned on/off by the clock signals $\phi$1 and $\phi$1. An EXNOR circuit 103 (i.e., exclusive NOR circuit) which supplies a control signal to a second switching transistor 105 and a third switching transistor 106 via an inverter 108 in response to the output signals from the delay circuit 101 and from the first switching transistor 102. Similarly, an EXNOR circuit 203 supplies a control signal to a second switching transistor 205 and to a third switching transistor 206 via an inverter 208 in response to the output signals from the delay circuit 201 and from the first switching transistor 202. Furthermore, in order to assure the operation even if the delay circuits 101 and 201 are failed, non-inverting buffer circuits 104 and 204 are respectively provided.

Figure 2:
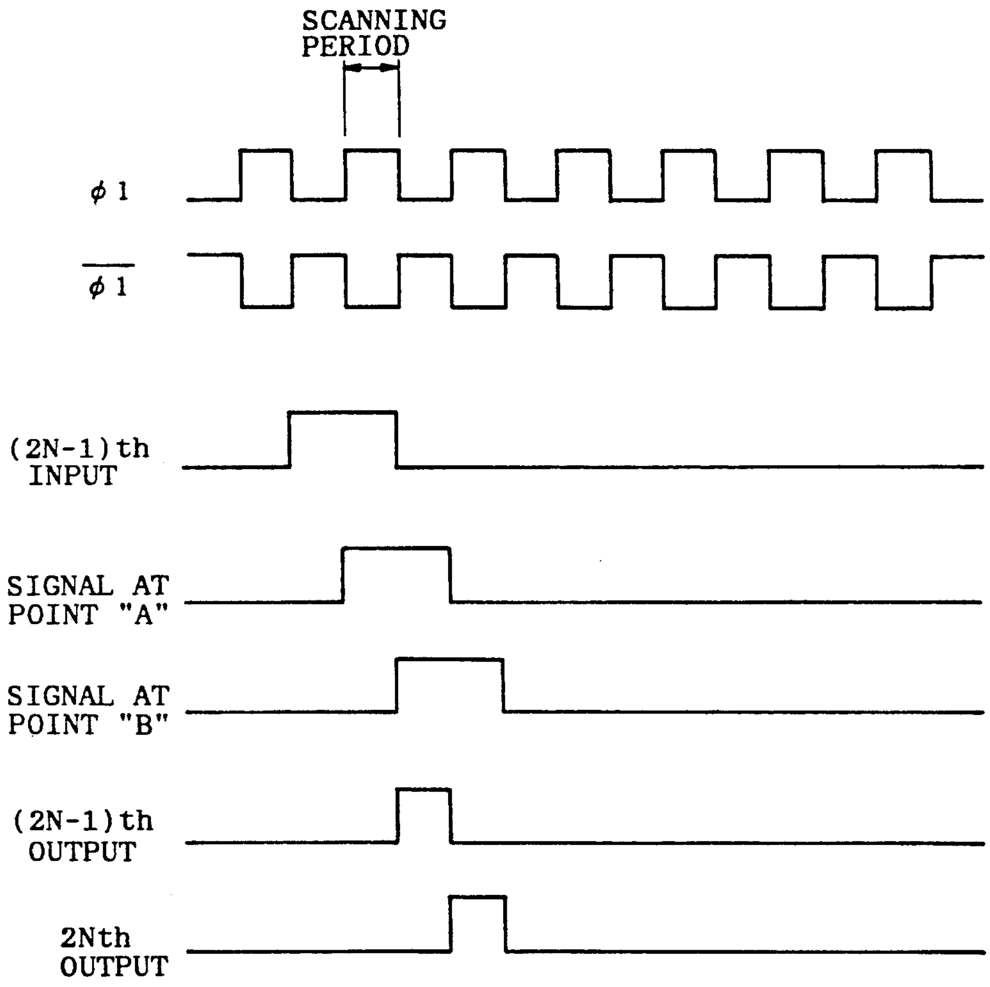
FIG. 2 is a timing chart of the scanning circuit shown in FIG. 1.

The (2N−1)th bit part 11 is provided with an output buffer circuit 107 which consists of an inverter, and a NOR circuit to which is supplied output signals of the inverter and the clock signal $\phi$1 and a non-inverting buffer circuit. Similarly, the 2Nth bit part 21 is provided with an output buffer circuit 207 which consists of an inverter, a NOR circuit and a non-inverting buffer circuit, while the NOR circuit is supplied the clock signal $\phi$1 instead of the clock signal $\phi$1. FIG. 2 shows a timing chart of the circuit shown in FIG. 1.

In the (2N−1)th bit part 11, the EXNOR circuit 103 judges whether or not the output signal of the delay circuit 101 is correct, and then controls the second and third switching transistors 105 and 106 in accordance with result of the judgement. That is, if the delay circuit 101 generates a correct signal, this correct signal is fed to a point "A". However, if the delay circuit 101 generates an incorrect signal, an output signal generated by the non-inverting buffer circuit 104 is fed to the point "A". The signal fed to the point "A" is then picked up by the output buffer circuit 107 as a (2N−1)th output signal at the time when the clock signal $\phi$1 is set to the "0" level.

Similarly, in the 2Nth bit part 21, the EXNOR circuit 103 judges whether or not the output signal of the delay circuit 201 is correct, and then controls the second and third switching transistors 205 and 206 in accordance with result of the judgement. Then, a signal generated by the delay circuit 201 or by the non-inverting buffer circuit 204 is fed to a point "B", and then picked up by the output buffer circuit 107 as a 2Nth output signal at the time when the clock signal $\phi$1 is set to the "0" level.

The above described scanning circuit was manufactured on a poly-SHIFT by way of experiment. As a result of subsequent testing, the percentage of effectiveness of 50% in the conventional scanning circuit was improved to 70%.

According to the first embodiment, the clock signals fed to the output buffer circuits 107 and 207 are the same signals $\phi$1 and $\phi$1 which are respectively fed to the delay circuits 101 and 201, etc. However, the clock signals fed to the output buffer circuits 107 and 207 can be embodied by two other clock signals which are respectively delayed for $\theta$ (where $0<\theta<T/4$, T designates a period of the signals $\phi$1 and $\phi$1), from the signals $\phi$1 and $\phi$1.

SECOND EMBODIMENT

Figure 3:
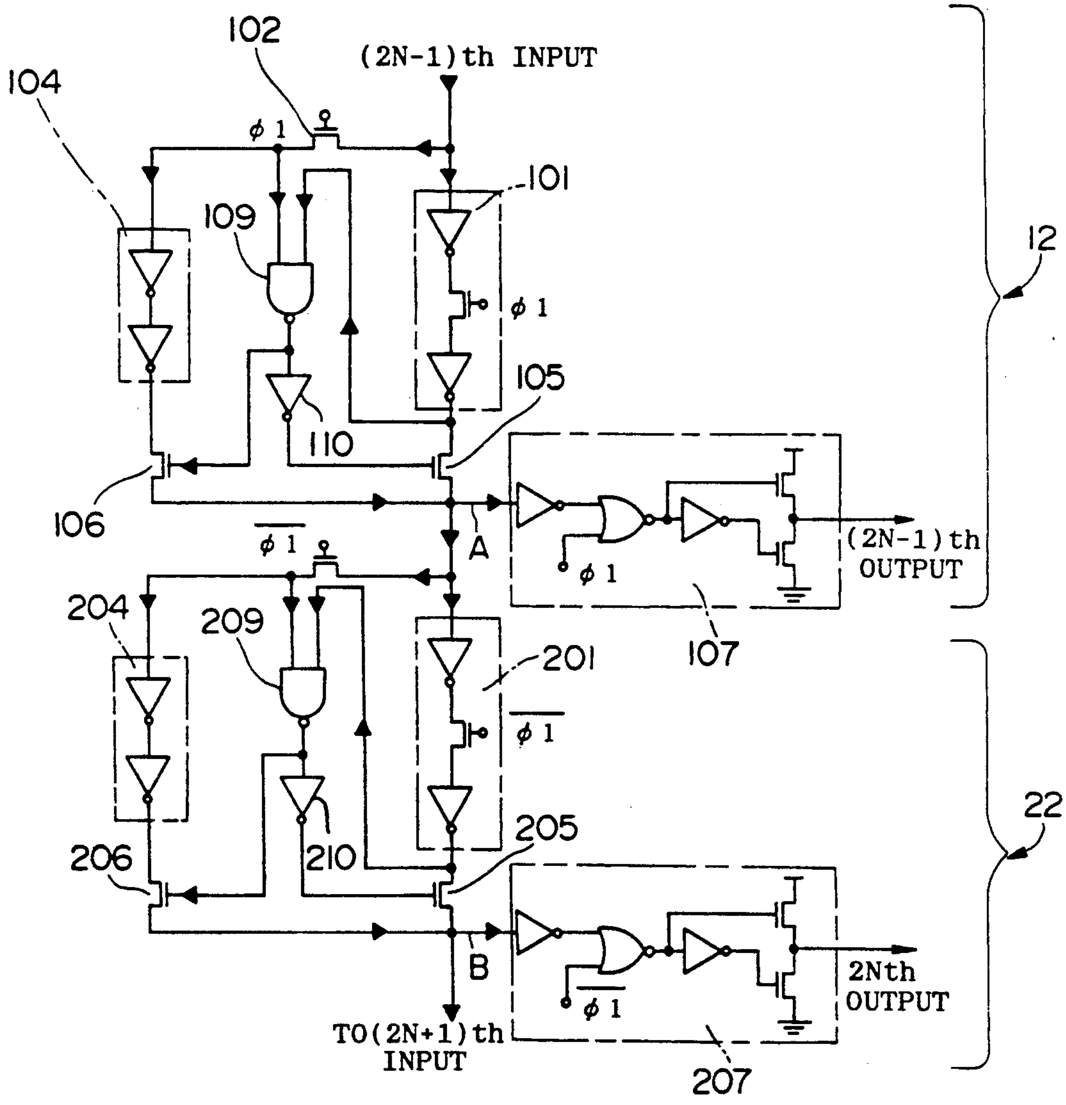
FIG. 3 is a block diagram showing an electronic configuration of a scanning circuit according to a second embodiment of the present invention.

FIG. 3 is a block diagram showing an electronic configuration of a liquid crystal display according to a second embodiment of the present invention. In FIG. 3, a (2N−1)th bit part 12 contains a NAND circuit 109 and an inverter 110 instead of the EXNOR circuit 103 and the inverter 108 which are contained in the first embodiment. Similarly, a 2Nth bit part 22 contains a NAND circuit 209 and an inverter 210 instead of the EXNOR circuit 203 and the inverter 208 in the first embodiment.

In a manner similar to that of the first embodiment, if the delay circuit 101 generates an incorrect signal, the output signal of the non-inverting buffer circuit 104 is supplied to the point "A" as a scanning signal. However, if the delay circuit 101 generates a correct signal, the "1" level portion of the scanning signal will be supplied by the delay circuit 101 and the "0" level portion of the scanning signal will be supplied by the 104. The 2Nth bit part 22 operates in a manner similar to the (2N−1)th bit part 12.

Accordingly, the circuit shown in FIG. 3 no longer operates correctly in the cases such that the non-inverting buffer circuit 104 fails to generate "0" level signal and thereby always generates the "1" level signal, even if the circuit 101 operates correctly.

However, the second embodiment has a remarkable advantage compared with the first embodiment. That is, for judging whether or not the delay circuit 101 operates correctly, the first embodiment adopts the EXNOR circuit 103 which usually contains eleven (11) transistors. In contrast, the NAND circuit 109 adopted in the second embodiment can be composed of just three (3) transistors. Accordingly, compared with the first embodiment, the second embodiment is advantageous in having a lower defective percentage of the circuit for judging the operation of circuit 101.

THIRD EMBODIMENT

Figure 4:
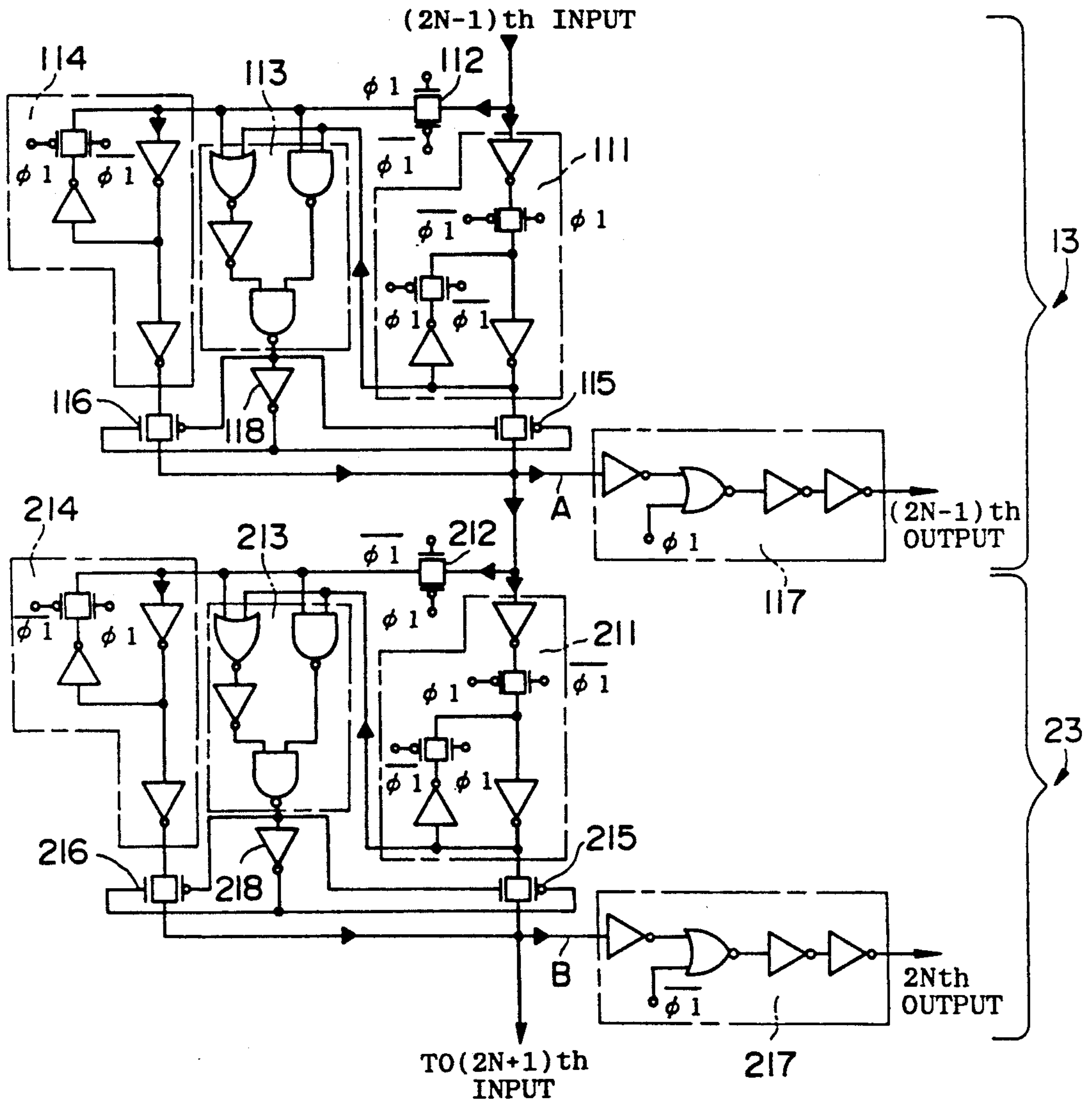
FIG. 4 is a block diagram showing an electronic configuration of a scanning circuit according to a third embodiment of the present invention.

FIG. 4 is a block diagram showing an electronic configuration of a scanning circuit composed of CMOS static circuits for driving a liquid crystal display according to a third embodiment of the present invention. In FIG. 4, components 111-118 and 211-218 correspond to those designated by 101-108 and 201-208 in FIG. 1. Accordingly, a basic algorithm of the third embodiment is similar to that of the first embodiment. Since, the third embodiment is composed of CMOS static circuits, the delay circuits 111, etc., contain a feedback circuit which is controlled by the clock signals $\phi$1 and $\phi$1.

The third embodiment, composed of CMOS static circuits is advantageous in power consumption and operation margin compared with the first and second embodiments. Accordingly, even though the number of transistors employed in the third embodiment may be larger than in the first or the second embodiment, the required circuit mounting area of the third embodiment is similar to or less than that of the first or the second embodiment. Furthermore, the percentage of defects in the whole device can be minimized.

FOURTH EMBODIMENT

Figure 5:
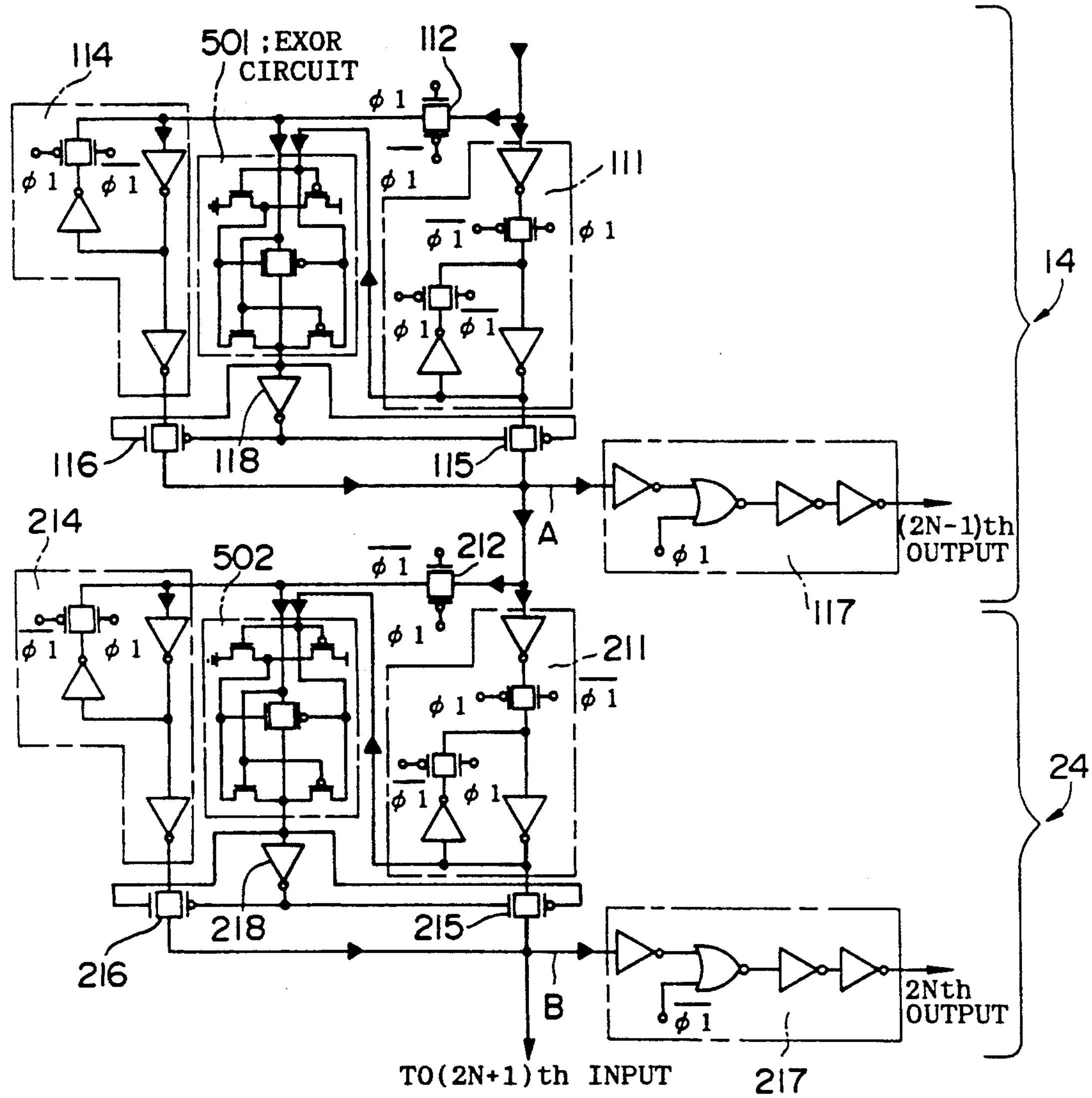
FIG. 5 is a block diagram showing an electronic configuration of a scanning circuit according to a fourth embodiment of the present invention.
Figure 6:
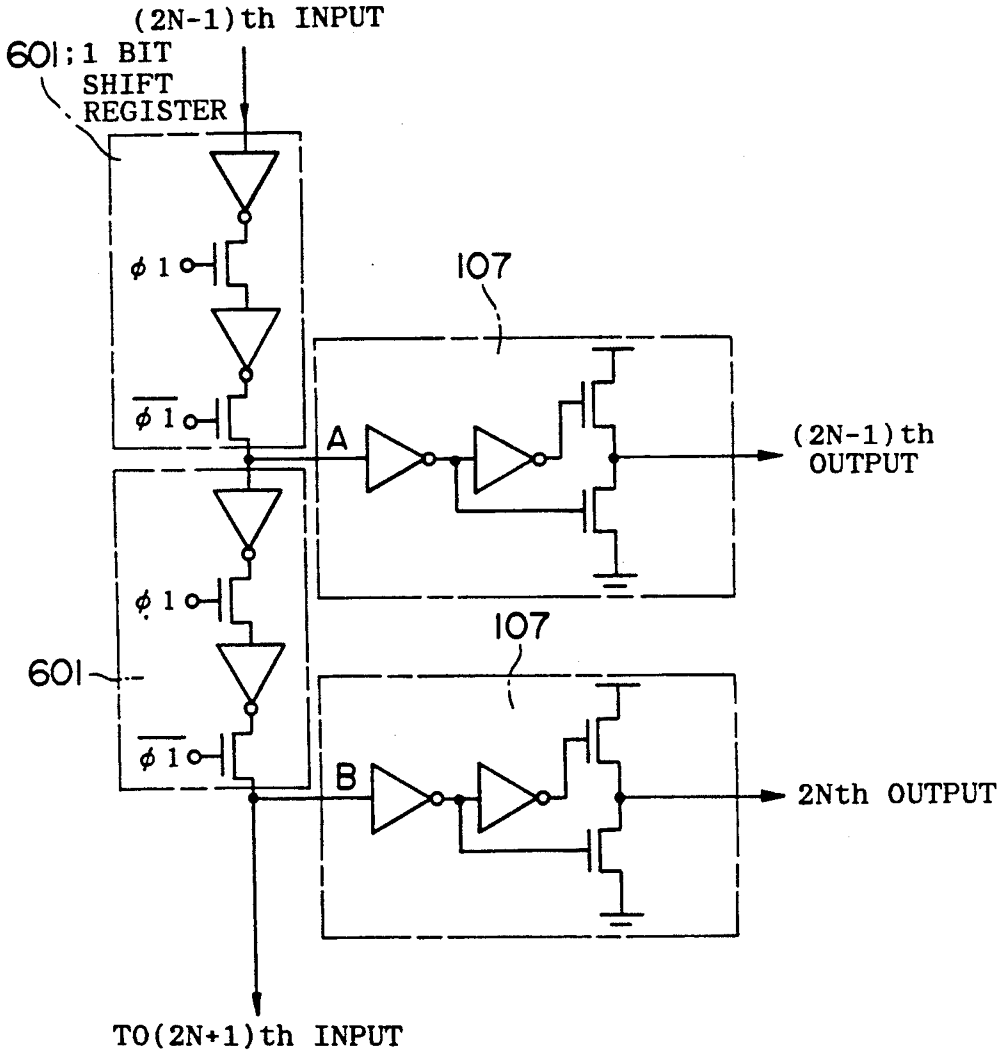
FIG.6 (PRIOR ART)
FIG. 6 is a block diagram showing an electronic configuration of a conventional scanning circuit.
Figure 7:
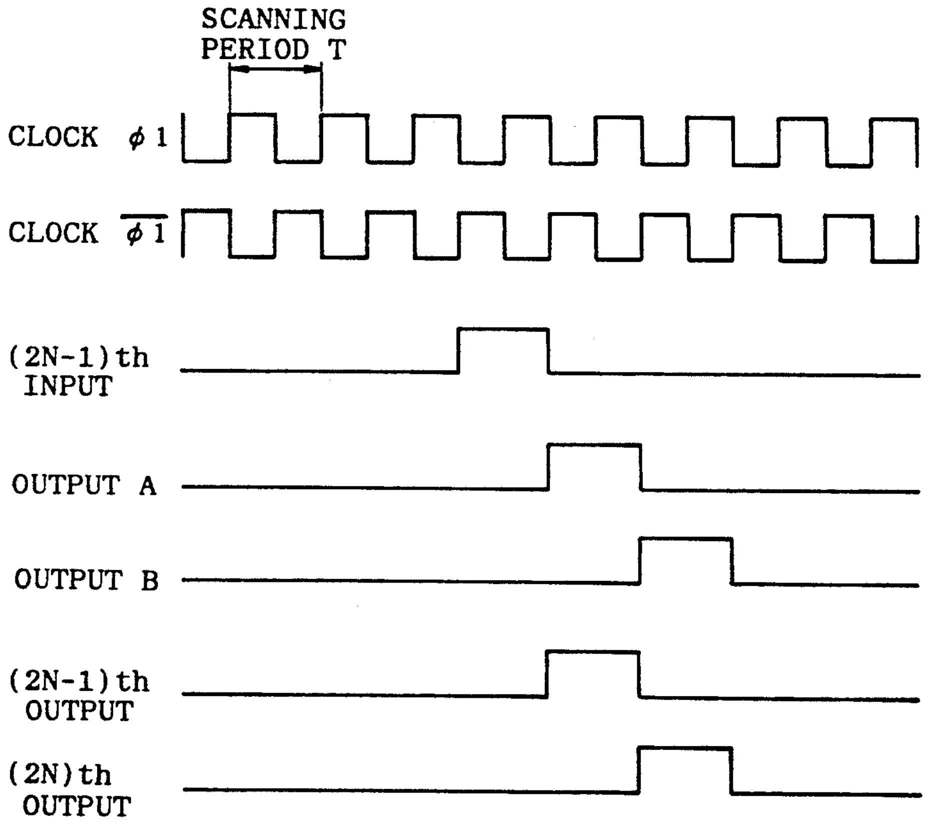
FIG.7 (PRIOR ART)
FIG. 7 is a timing chart of the scanning circuit shown in FIG. 6.

FIG. 5 is a block diagram showing an electronic configuration of a scanning circuit composed of CMOS static circuits for driving a liquid crystal display according to a fourth embodiment of the present invention. In FIG. 5, a (2N−1)th bit part 14 contains a EXOR circuit 501 instead of the EXNOR circuit 113 contained in the third embodiment. Similarly, a 2Nth bit part 24 contains a EXOR circuit 502 instead of the EXNOR circuit 213. Because the EXOR circuit 501 can be embodied by six (6) transistors, the fourth embodiment is advantageous in that less circuit mounting area is required and in having a lower defective percentage of the whole device compared with the third embodiment with the EXNOR circuit 113 which contains fourteen (14) transistors.

As described heretofore, according to the present invention, even if one of the delay circuits or the non-inverting buffer circuits fails, another circuit operates correctly, so that the entire scanning circuit can operate correctly. Furthermore, switching operation between the delay circuit and the non-inverting buffer circuit can be automatically performed; therefore there is no need for providing external devices for detecting the circuit defects of the circuit and no need for additional processes for defect correction such as laser-trimming-methods and the like. According to such advantages, the present invention minimizes the defective percentage of the entire liquid crystal display.

This invention may be practiced or embodied in still other ways without departing from the spirit or essential character thereof. For example, in the present embodiments, the scanning circuits are adopted for driving the liquid crystal displays; other embodiments can be adopted for driving other type of capacitive loads, etc.

Therefore, the preferred embodiments described herein are illustrative and not restrictive, the scope of the invention being indicated by the appended claims, and all variations which fall within the meaning of the claims are intended to be embraced therein.

What is claimed is:

1. A scanning circuit for successively scanning a plural number of capacitive loads comprising:

- a delay circuit for delaying a supplied pulse signal from a previous stage circuit in accordance with a first clock signal;
- a first switching transistor which receives said pulse signal and is controlled by said first clock signal;
- an exclusive OR circuit which receives a signal generated by said delay circuit and a signal generated by said first switching transistor;
- a first non-inverting buffer circuit which receives said signal generated by said first switching transistor;
- a second switching transistor which receives said signal generated by said delay circuit and is controlled in accordance with an inverted signal of said signal generated by said exclusive OR circuit;
- a third switching transistor which receives a signal generated by said first non-inverting buffer circuit and is controlled in accordance with said signal generated by said exclusive OR circuit; and
- an output buffer circuit which receives signals respectively generated by said second switching transistor and said third switching transistor and is controlled in accordance with said first clock signal.

2. A scanning circuit according to claim 1, wherein said output buffer circuit is further comprising:

- an inverter circuit which inverts s signal supplied thereto;
- a NOR circuit which receives a signal generated by said inverter and said first clock signal; and
- a second non-inverting buffer circuit which receives a signal generated by said NOR circuit.

3. A scanning circuit for successively scanning a plural number of capacitive loads comprising:

- a delay circuit for delaying a supplied pulse signal from a previous stage in accordance with a first clock signal;
- a first switching transistor which receives said pulse signal and is controlled by said first clock signal;
- an NAND circuit which receives a signal generated by said delay circuit and a signal generated by said first switching transistor;
- a first non-inverting buffer circuit which receives said signal generated by said first switching transistor;
- a second switching transistor which receives said signal generated by said delay circuit and is controlled in accordance with an inverted signal of said signal generated by said NAND circuit;
- a third switching transistor which receives a signal generated by said first non-inverting buffer circuit and is controlled in accordance with said signal generated by said NAND circuit; and
- an output buffer circuit which receives signals respectively generated by said second switching transistor and said third switching transistor and is controlled in accordance with said first clock signal.

4. A scanning circuit according to claim 1 wherein phase of said first clock signal is the inverse of that of said previous stage circuit.

5. A scanning circuit for successively scanning a plural number of capacitive loads comprising:

- a delay circuit for delaying a supplied pulse signal from a previous stage circuit in accordance with a first clock signal;
- a first switching transistor which receives said pulse signal and is controlled by said first clock signal;
- an exclusive OR circuit which receives a signal generated by said delay circuit and a signal generated by said first switching transistor;
- a first non-inverting buffer circuit which receives said signal generated by said first switching transistor;
- a second switching transistor which receives said signal generated by said delay circuit and is controlled in accordance with an inverted signal of said signal generated by said exclusive OR circuit;

a third switching transistor which receives a signal generated by said first non-inverting buffer circuit and is controlled in accordance with said signal generated by said exclusive OR circuit; and an output buffer circuit which receives signals respectively generated by said second switching transistor and said third switching transistor and is controlled in accordance with a second clock signal.

6. A scanning circuit according to claim 5, wherein said output buffer circuit is further comprising:

an inverter circuit which inverts a signal supplied thereto;

a NOR circuit which receives a signal generated by said inverter and said second clock signal; and a second non-inverting buffer circuit which receives a signal generated by said NOR circuit.

7. A scanning circuit for successively scanning a plural number of capacitive loads comprising:

a delay circuit for delaying a supplied pulse signal from a previous stage in accordance with a first clock signal;

a first switching transistor which receives said pulse signal and is controlled by said first clock signal;

an NAND circuit which receives a signal generated by said delay circuit and a signal generated by said first switching transistor;

a first non-inverting buffer circuit which receives said signal generated by said first switching transistor;

a second switching transistor which receives said signal generated by said delay circuit and is controlled in accordance with an inverted signal of said signal generated by said NAND circuit;

a third switching transistor which receives a signal generated by said first non-inverting buffer circuit and is controlled in accordance with said signal generated by said NAND circuit; and an output buffer circuit which receives signals respectively generated by said second switching transistor and said third switching transistor and is controlled in accordance with a second clock signal.

8. A scanning circuit according to claim 5 wherein phase of said first clock signal is the inverse of that of said previous stage circuit.

9. A scanning circuit according to claim 5 wherein said second clock signal leads $\theta$ from said first clock signal, where $0<\theta<T/4$, T designates a period of said first clock signal.

10. A scanning circuit according to claim 7 wherein said second clock signal leads $\theta$ from said first clock signal, where $0<\theta<T/4$, and T designates a period of said first clock signal. 4

* * * * *